(12) United States Patent
Chen

(10) Patent No.: US 7,564,318 B2
(45) Date of Patent: Jul. 21, 2009

(54) SWITCH CAPACITANCE AND VARACTOR BANKS APPLIED TO VOLTAGE CONTROLLED OSCILLATOR HAVING CONSTANT FREQUENCY TUNING SENSITIVITY

(75) Inventor: Jui-Pin Chen, Taoyuan (TW)

(73) Assignee: Sunplus Technology Co., Ltd., Hsinchu Science Park (TW)

( * ) Notice: Subject to any disclaimer, the term of this patent is extended or adjusted under 35 U.S.C. 154(b) by 75 days.

(21) Appl. No.: 11/941,299

(22) Filed: Nov. 16, 2007

(65) Prior Publication Data

US 2008/0174379 A1    Jul. 24, 2008

(30) Foreign Application Priority Data

Nov. 17, 2006    (TW) .............................. 95142670 A

(51) Int. Cl.
*H03B 5/08*    (2006.01)
*H03B 5/12*    (2006.01)
*H03C 3/22*    (2006.01)

(52) U.S. Cl. ........................... 331/177 V; 331/117 FE; 331/179

(58) Field of Classification Search ............... 331/36 C, 331/117 R, 117 FE, 117 D, 177 R, 177 V, 331/179
See application file for complete search history.

(56) References Cited

U.S. PATENT DOCUMENTS

| | | | |
|---|---|---|---|
| 6,621,362 B2 * | 9/2003 | Momtaz et al. | 331/117 R |
| 7,038,552 B2 | 5/2006 | Brett et al. | |
| 7,102,454 B2 * | 9/2006 | Sze et al. | 331/117 FE |
| 7,221,234 B2 * | 5/2007 | Chien | 331/177 V |
| 7,479,839 B1 * | 1/2009 | Kossel et al. | 331/177 V |
| 7,482,887 B2 * | 1/2009 | Cyr et al. | 331/108 C |

\* cited by examiner

*Primary Examiner*—David Mis
(74) *Attorney, Agent, or Firm*—Kirton & McConkie; Evan R. Witt

(57) ABSTRACT

A variable capacitance applied to a voltage controlled oscillator includes a switch capacitance bank including a plurality of controllable capacitor paths for selectively connected between a first node and a second node in parallel; and, a switch variactor bank including a plurality of controllable variactor paths for selectively connected between the first node and the second node in parallel; wherein each controllable variactor path provides a tunable capacitance value according to an input voltage.

9 Claims, 5 Drawing Sheets

SWITCH CAPACITANCE AND VARACTOR BANKS APPLIED TO VOLTAGE CONTROLLED OSCILLATOR HAVING CONSTANT FREQUENCY TUNING SENSITIVITY

FIELD OF THE INVENTION

The present invention relates to a voltage controlled oscillator (VCO), and more particularly to a switch capacitance bank and a switch varactor bank that enable a VCO to have a constant frequency tuning sensitivity (Kvco).

BACKGROUND OF THE INVENTION

Generally speaking, a voltage controlled oscillator (VCO) is contained in a phase locked loop (PLL) circuit and applied to a digital circuit or an analog circuit. The application is particularly common in the communication field that requires wide range adjustment of frequency.

Please refer to FIG. 1, which illustrates a conventional VCO. The VCO is disclosed in U.S. Pat. No. 7,038,552. As shown in the FIG. 1, a first inductor 2 is connected between a voltage source (Vcc) and a drain of a first field effect transistor (FET) 6. A source of the first FET 6 is connected to a current source 10. Similarly, a second inductor 22 is connected between the voltage source (Vcc) and a drain of a second FET 26. A source of the second FET 26 is connected to the current source 10. Furthermore, the drain of the first FET 6 and a gate of the second FET 26 are connected to each other; the drain of the second FET 26 and a gate of the first FET 6 are also connected to each other. Finally, a variable capacitance is provided between the drain of the first FET 6 (node a) and the drain of the second FET 26 (node b). Therefore, the inductors (the first inductor 2 plus the second inductor 22) connected in parallel with the variable capacitance between node a and node b are seen as a LC oscillating circuit. Further, the variable capacitance includes a switch capacitance bank 40 and a varactor unit 42. The switch capacitance bank 40 is used for coarse-tuning output frequency of the VCO while the varactor unit 42 is used for fine-tuning the output frequency of the VCO.

As shown in the FIG. 1, the switch capacitance bank 40 comprises a plurality of controllable capacitor paths connected in parallel. Each controllable capacitor path includes a first capacitor 50, a switch FET 54 and a second capacitor 52 connected in series between node a and node b. By controlling a gate of the switch FET 54, each controllable capacitor path can selectively achieve connection or disconnection between node a and node b. When a controllable capacitor path is connected between node a and node b, an equivalent capacitance value of the variable capacitance will be increased; similarly, when a controllable capacitor path is disconnected between node a and node b, the equivalent capacitance value of the variable capacitance will be decreased. Consequently, the output frequency of VCO can be coarse-tuned by the above described method.

Further, as shown in the FIG. 1, the Varactor unit 42 comprises two FETs 60 and 62 whose drain and source are connected to each other; while gates of the FETs 60 and 62 are connected respectively to node a and node b and drains of FETs 60 and 62 are connected to a voltage control terminal 64. When an input voltage of the voltage control terminal 64 changes, the change in the voltage difference between drain and gate of FET 60 and 62 leads to changes in the capacitance value of FET 60 and 62. Consequently, by changing the input voltage of voltage control terminal 64, the output frequency of VCO can be fine-tuned. In addition to FETs 60 and 62 changing capacitance values in response to the input voltage, the FETs 60 and 62 in the varactor unit 42 also can be replaced by varicap diodes.

Please refer to FIG. 2, which illustrates the output frequency of a conventional VCO. As illustrated, the adjustable output frequency tuning range is between f0~f7, in which a first band (f5~f7) is completed by a first capacitance value c1 provided by the first controllable capacitor path of the switch capacitance bank 40 and a changeable capacitance value ($\Delta c$) provided by varactor unit 42; a second band II (f3~f6) is completed by the first capacitance value c1 plus a second capacitance value c2 (i.e. c1+c2) provided respectively by the first and second controllable capacitor paths in the switch capacitance bank 40 and the changeable capacitance value ($\Delta c$) provided by the varactor unit 42; a third band III (f1~f4) is completed by the first capacitance value c1 plus the second capacitance value c2 and a third capacitance value (i.e. c1+c2+c3), provided respectively by the first, second and third controllable capacitor paths in the switch capacitance bank 40 and the changeable capacitance value ($\Delta c$) provided by varactor unit 42; a fourth band IV (f0~f2) is completed by the first capacitance value c1 plus the Second capacitance value c2, the third capacitance value c3 and a fourth capacitance value c4 (i.e. c1+c2+c3+c4), provided respectively by the first, second, third and fourth controllable capacitor paths in switch capacitance bank 40 and the changeable capacitance value ($\Delta c$) provided by varactor unit 42. Since the output frequency of VCO is proportional to $1/\sqrt{LC}$ and the changeable capacitance value ($\Delta c$) provided by varactor unit 42 is fixed, as the capacitance value provided by the switch capacitance bank 40 increases, the band for which the output frequency of VCO responds to will become narrower.

Further, a frequency tuning sensitivity (Kvco) of the VCO is defined by its output frequency range divided by its input voltage range ($\Delta f/\Delta V$). As illustrated by FIG. 2, the lower the conventional output frequency of VCO, the smaller Kvco. That is to say, the conventional VCO cannot provide a constant frequency tuning sensitivity (Kvco). From a designer's perspective, when Kvco varies according to the variation of output frequency, the overall PLL circuit design becomes complicated, particularly for the design of the loop filter connected to VCO in the PLL.

SUMMARY OF THE INVENTION

Therefore, the present invention provides a switch capacitance bank and a switch varactor bank that enable a VCO to have a constant frequency tuning sensitivity (Kvco)

The present invention discloses a variable capacitance applied to a voltage controlled oscillator, comprising: a switch capacitance bank including a plurality of controllable capacitor paths for selectively connected between a first node and a second node in parallel; and, a switch variactor bank including a plurality of controllable variactor paths for selectively connected between the first node and the second node in parallel; wherein each controllable variactor path provides a tunable capacitance value according to an input voltage.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

Figure 3:
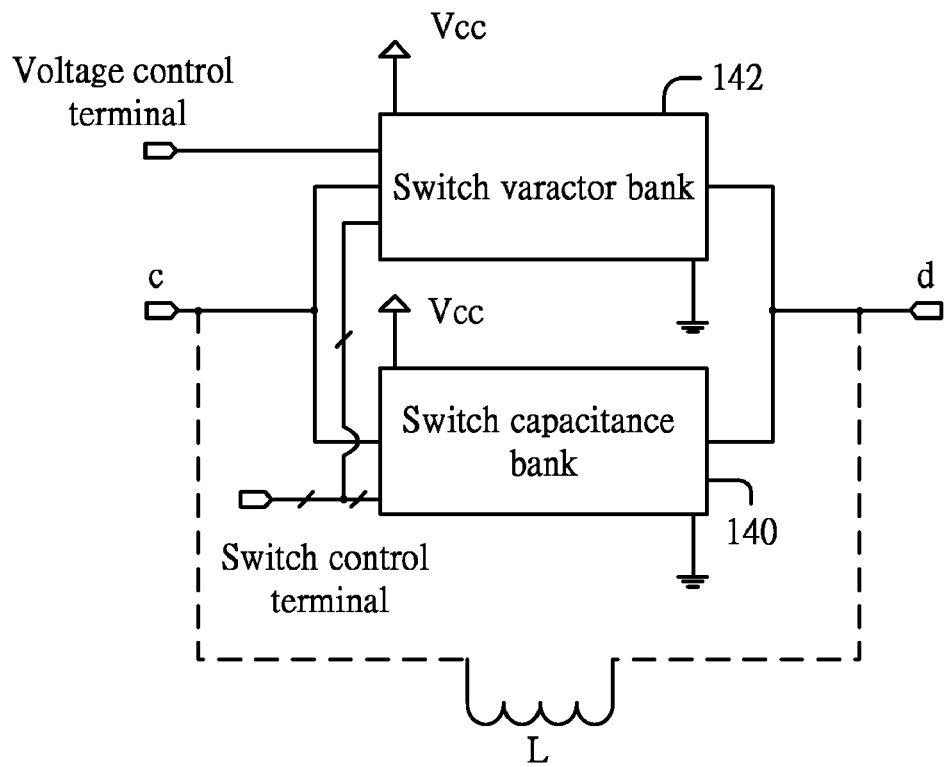
FIG. 3 illustrates an embodiment of a variable capacitance applied to the VCO.

Please refer to FIG. 3, which illustrates an embodiment of a variable capacitance applied to the VCO. The variable capacitance connected between node c and node d comprises a switch capacitance bank 140 and a switch varactor bank 142, in which, the switch capacitance bank 140 is used for coarse-tuning output frequency of the VCO and the switch varactor bank 142 is used for fine-tuning output frequency of the VCO.

Figure 1:
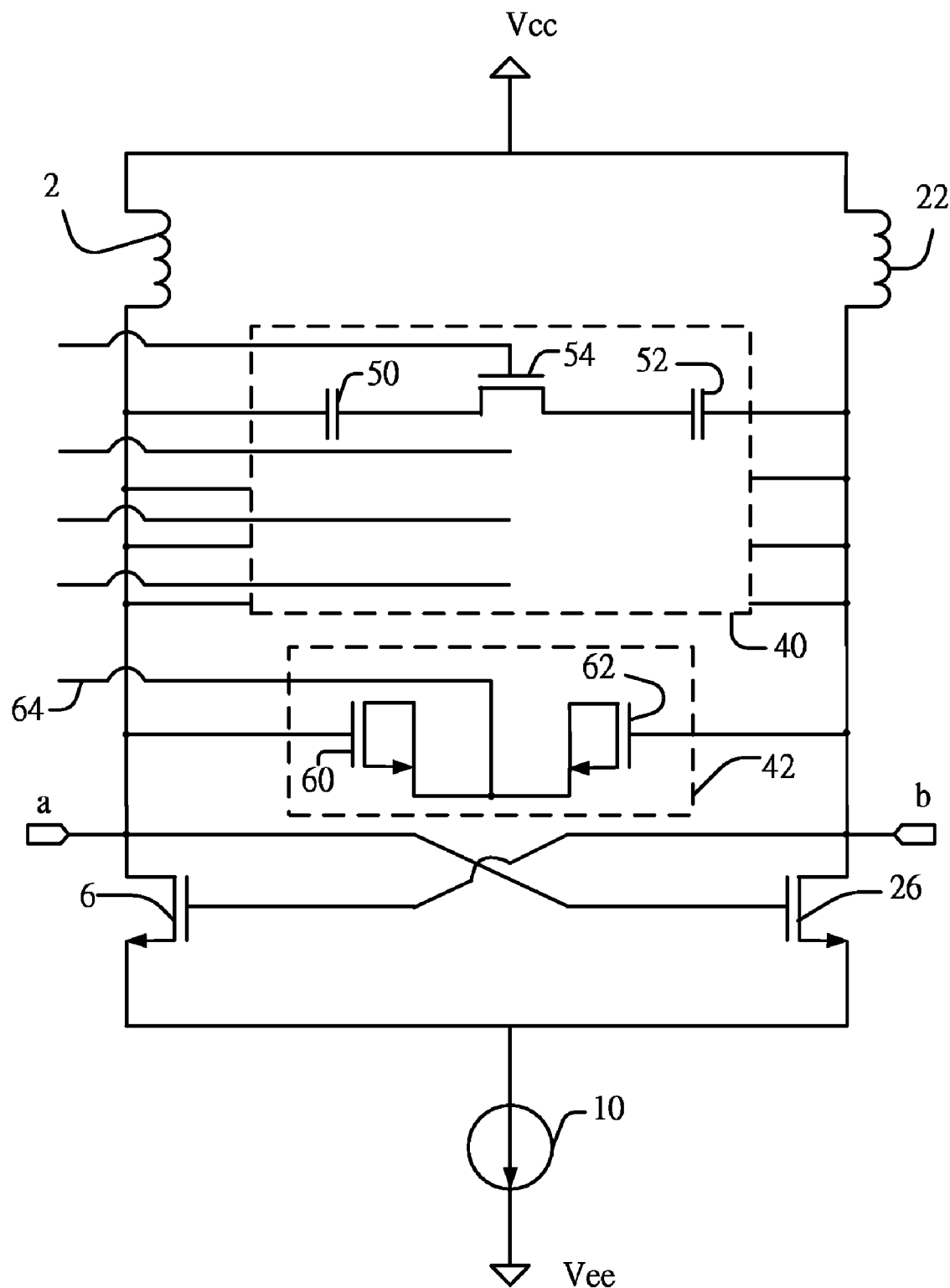
FIG. 1 illustrates a conventional VCO.
Figure 2:
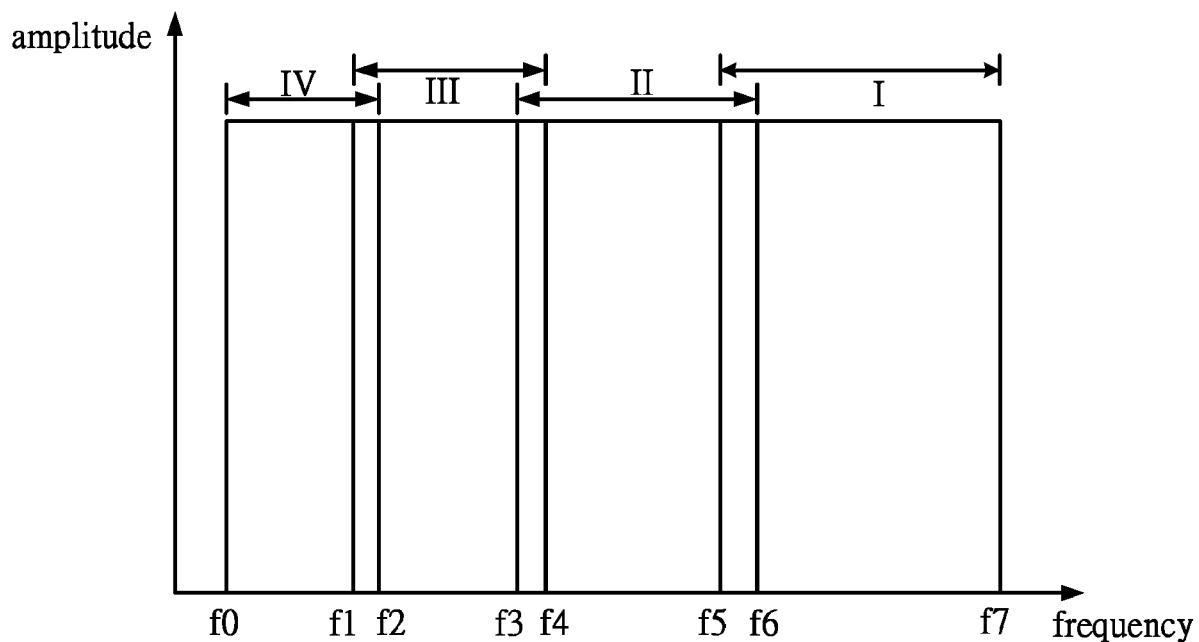
FIG. 2 illustrates the output frequency of a conventional VCO.

As shown in the FIG. 3, the switch capacitance bank 140 and the switch varactor bank 142 are connected in parallel between node c and node d. Under small signal model, an inductor L is connected between node c and node d so that the inductor L and the variable capacitance form a LC oscillating circuit. The structure of switch capacitance bank 140 is similar with conventional switch capacitance bank, which comprises a plurality of controllable capacitor paths connected in parallel. Each controllable capacitor path includes a switch. These controllable capacitor paths can achieve connection or disconnection between node c and node d by controlling the corresponding switch control terminals of the switches. When a controllable capacitor path is connected between node c and node d the equivalent capacitance value of the variable capacitance increases. Conversely, when the controllable capacitor path is disconnected between node c and node d the equivalent capacitance value of variable capacitance decreases. Because the structure of switch capacitance bank is not confined to the switch capacitance bank 40 in FIG. 1, the structure of switch capacitance bank is not restricted in the present invention.

The switch varactor bank 142 comprises a plurality of controllable varactor paths connected in parallel. Each controllable capacitor path includes a switch. These controllable varactor paths can achieve connection or disconnection between node c and node d by controlling the corresponding switch control terminals of the switches. According to the embodiment of the present invention, one switch control terminal simultaneously controls one switch in the controllable capacitor path and one switch in the controllable varactor path. That is, one controllable varactor paths in the switch varactor bank 142 and one controllable capacitor paths in the switch capacitance bank 140 are one to one correspondence. When a controllable capacitor path achieves connection between node c and node d by one switch control terminal, the corresponding controllable varactor path also achieves connection between node c and node d.

Further, all the controllable varactor paths are also connected to a voltage control terminal. When an input voltage of the voltage control terminal changes, the change in the voltage difference leads to changes in the capacitance value of all controllable varactor paths. Consequently, by connecting the controllable varactor path between node c and node d and changing the input voltage of voltage control terminal, the output frequency of VCO can be fine-tuned.

As the adjustable capacitance range of the conventional varactor unit is fixed, adjustable frequency ranges of each band are different which lead to varied Kvco. Applying the presently invented switch varactor bank 142, an adjustable frequency range of each band is made the same through design and then a constant Kvco can be achieved.

Figure 4:
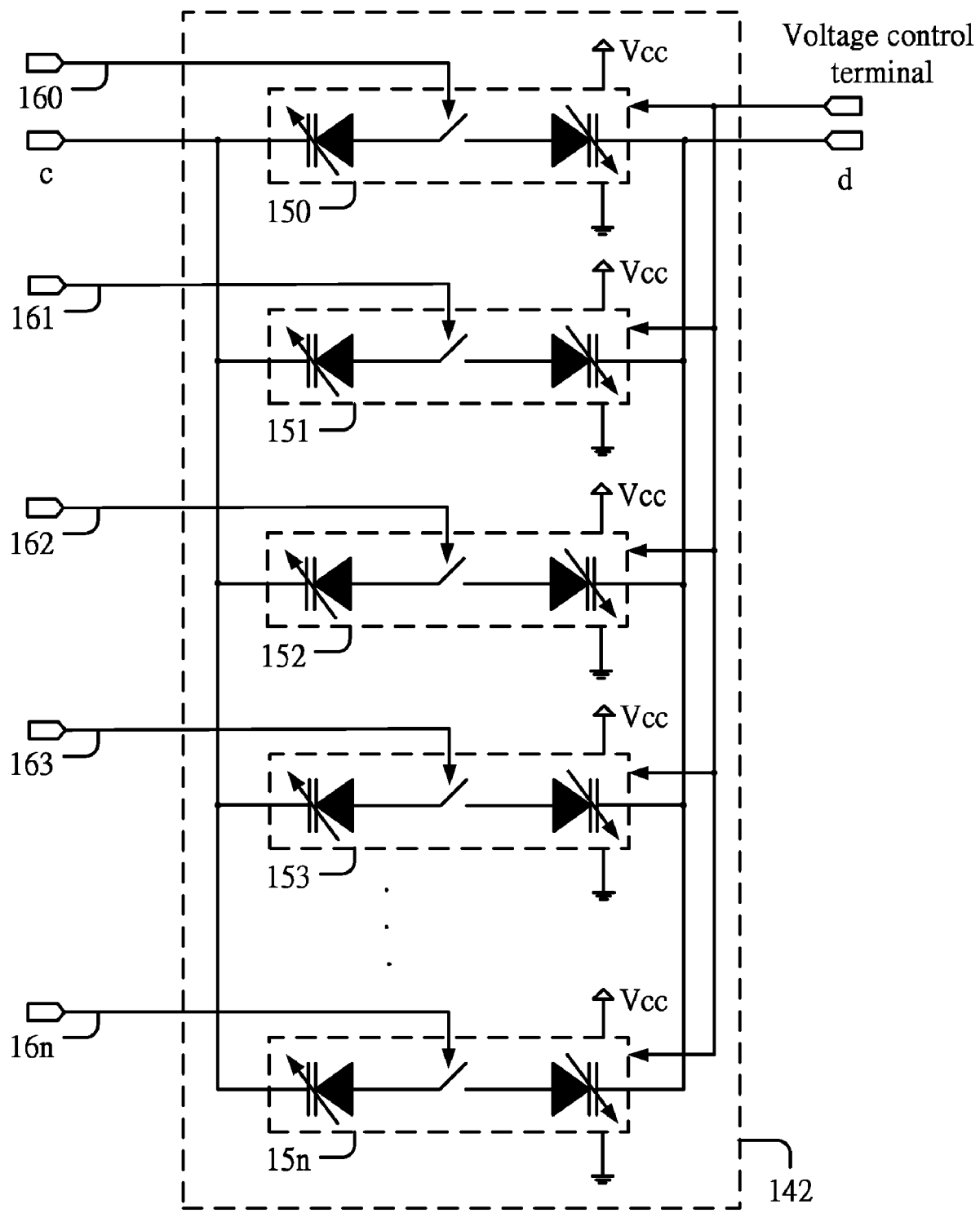
FIG. 4 illustrates the switch varactor bank of the present invention.

Please refer to FIG. 4, which illustrates the switch varactor bank 142 of the present invention. The switch varactor bank 142 comprises of n controllable varactor paths 150~15n. Each controllable varactor path includes a switch. And, n control terminals 160~16n are connected the corresponding switches for achieving connection or disconnection between node c and node d. Furthermore, each switch control terminal of the controllable varactor path is connected to one corresponding switch of the controllable capacitor path in the switch capacitance bank 140. That is to say, when the first switch control terminal 160 controls the first controllable varactor path 150 to achieve connection between node c and node d, the corresponding first controllable capacitor path also achieves connection between node c and node d. Further, each controllable varactor path includes at least one varicap diode, so a capacitance value of each varicap diode can be varied according to the variation of the input voltage applied to the voltage control terminal.

Figure 5:
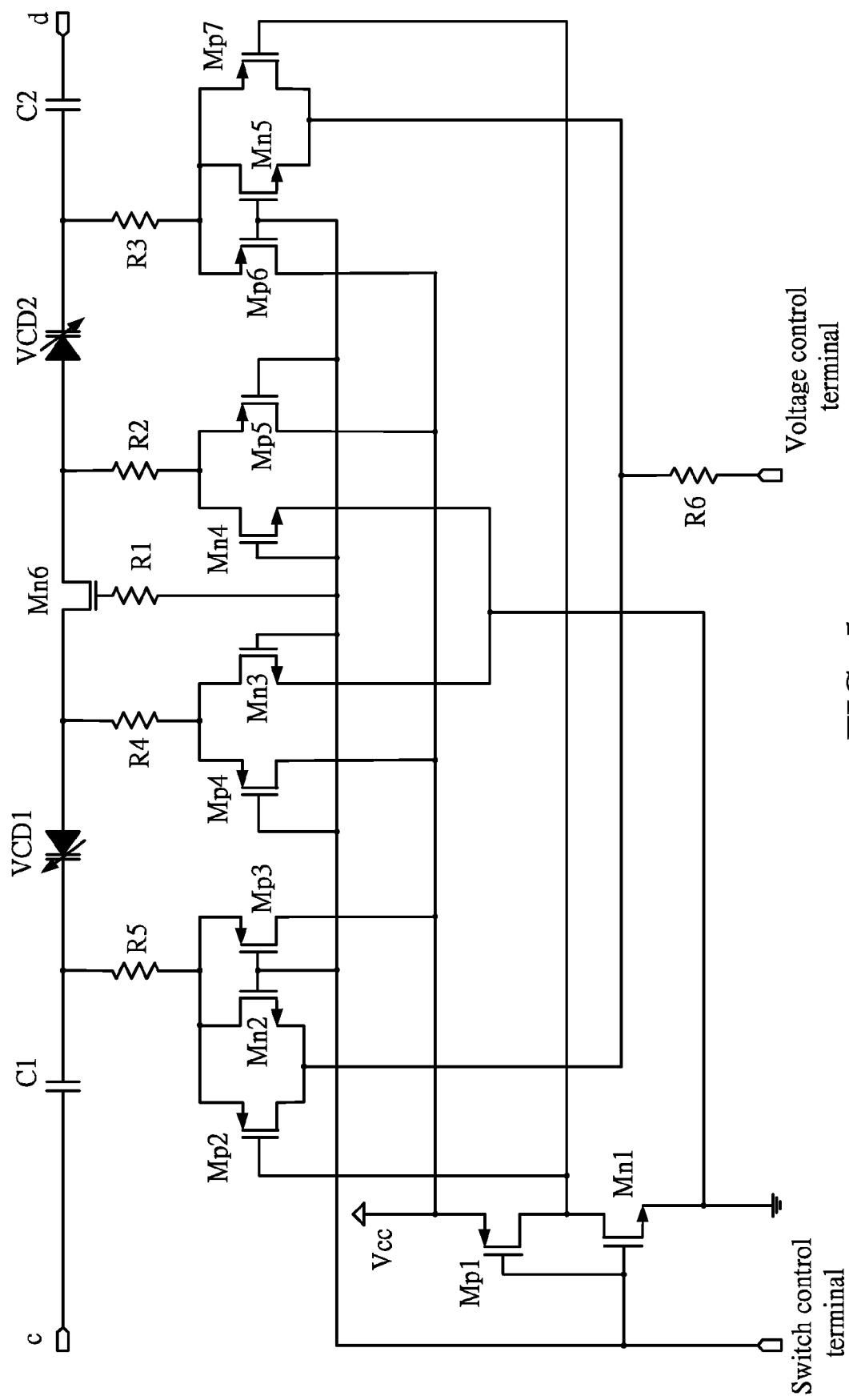
FIG. 5 illustrates circuit diagram of one controllable varactor path.

Please refer to FIG. 5, which illustrates circuit diagram of one controllable varactor path. As shown, connected in series between node c node d are a first capacitor C1, a first varicap diode VCD1, a switch transistor Mn6, a second varicap diode VCD2 and a second capacitor C2. One end of the first capacitor C1 is connected to node c, the other end of the first capacitor C1 is connected to a kathode of the first varicap diode VCD1; an anode of the first varicap diode VCD1 is connected to one end of the switch transistor Mn6, the other end of the switch transistor Mn6 is connected to the anode of the second varicap diode VCD2; the kathode of the second varicap diode VCD2 is connected to one end of the second capacitor C2, the other end of the second capacitor C2 is connected to node d.

Further, the control circuit of the said controllable varactor path comprises a not gate consisting of a first P transistor Mp1 and a first N transistor Mn1. The switch control terminal is connected to an input terminal of the not gate, which is gates of the first P transistor Mp1 and the first N transistor Mn1. An output terminal of the not gate is drains of the first P transistor Mp1 and first N transistor Mn1. Further, a first resistor R1 is connected between a gate of the switch transistor Mn6 and the switch control terminal.

A second resistor R2 is connected between the anode of the second varicap diode VCD2 and a source of a fifth P transistor Mp5; a gate of the fifth P transistor Mp5 is connected to the switch control terminal; a drain of the fifth P transistor Mp5 is connected to voltage source (Vcc). A drain of a fourth N transistor Mn4 is connected to the source of the fifth P transistor Mp5; a gate of the fourth N transistor Mn4 is connected to the switch control terminal; a source of the fourth N transistor Mn4 is connected to the ground.

A third resistor R3 is connected between the kathode of the second varicap diode VCD2 and a source of a sixth P transistor Mp6; a gate of the sixth P transistor Mp6 is connected to the switch control terminal; a drain of the sixth P transistor Mp6 is connected to voltage source (Vcc). A drain of the fifth N transistor Mn5 is connected to the source of the sixth P transistor Mp6; a gate of the fifth N transistor Mn5 is connected to the switch control terminal; and a sixth resistor R6 is connected between a source of the fifth N transistor Mn5 and the voltage control terminal. A source of a seventh P transistor Mp7 is connected to the source of the sixth P transistor Mp6; a gate of the seventh P transistor Mp7 is connected to the output terminal of the not gate; a drain of the seventh P transistor Mp7 is connected to the source of the fifth N transistor Mn5.

A fourth resistor R4 is connected between the anode of the first varicap diode VCD1 and a source of a fourth P transistor Mp4; a gate of the fourth P transistor Mp4 is connected to the switch control terminal; and a drain of the fourth P transistor Mp4 is connected to the voltage source (Vcc). A drain of a third N transistor Mn3 is connected to the source of the fourth P transistor Mp4; a gate of the third N transistor Mn3 is connected to the switch control terminal; a source of the third N transistor Mn3 is connected to the ground.

A fifth resistor R5 is connected between the kathode of the first varicap diode VCD1 and a source of the third P transistor Mp3; a gate of the third P transistor Mp3 is connected to the switch control terminal; a drain of the third P transistor Mp3 is connected to the voltage source (Vcc). A drain of the second N transistor Mn2 is connected to the source of the third P transistor Mp3; a gate of the second N transistor Mn2 is connected to the switch control terminal; and a source of the second N transistor Mn2 is connected to the source of the fifth N transistor Mn5. A source of a second P transistor Mp2 is connected to the source of the third P transistor Mp3; a gate of the second P transistor Mp2 is connected to the output terminal of the not gate; and a drain of the second P transistor Mp2 is connected to the source of the second N transistor Mn2.

When a high level signal is applied to the switch control terminal, the not gate outputs a low level signal on the output terminal. And then, the switch transistor Mn6, the second P transistor Mp2, the second N transistor Mn2, the third N transistor Mn3, the fourth N transistor Mn4, the fifth N transistor Mn5 and the seventh P transistor Mp7 will be turned on; while the third P transistor Mp3, the fourth P transistor Mp4, the fifth P transistor Mp5 and the sixth P transistor Mp6 will be turned off.

Therefore, the controllable varactor path is connected between node c and node d. Also, the anode of the first varicap diode VCD1 is connected to the ground and the kathode of the first varicap diode VCD1 is connected to the voltage control terminal to form a reverse bias and form a broader depletion region of the first varicap diode VCD1. Consequently, a capacitance value of the first varicap diode VCD1 is controlled by the input voltage on the voltage control terminal to control the width of the depletion region. By the same logic, the anode of the second varicap diode VCD2 is connected to the ground and the kathode of the second varicap diode VCD2 is connected to the voltage control terminal to result in the reverse bias on the second varicap diode VCD2. Thus the capacitance value of the first varicap diode VCD2 is also controlled by the input voltage on the voltage control terminal.

When the controllable varactor path is connected between node c and node d, an equivalent capacitance value of the first capacitor C1, the first varicap diode VCD1, the second varicap diode VCD2 and the second capacitor C2 is provided by the controllable varactor path. Also, the equivalent capacitance of controllable varactor path can be varied through changing the input voltage on the voltage control terminal.

When a low level signal is applied to the switch control terminal, the not gate outputs a high level signal on the output terminal. And then, the switch transistor Mn6, the second P transistor Mp2, the second N transistor Mn2, the third N transistor Mn3, the fourth N transistor Mn4, the fifth N transistor Mn5 and the seventh P transistor Mp7 will be turned Off and the third P transistor Mp3, the fourth P transistor Mp4, the fifth P transistor Mp5 and the sixth P transistor Mp6 will be turned On. Hence, the controllable varactor path is disconnected between node c and node d and the anode and kathode of the first varicap diode VCD1 is connected to Vcc. Therefore, this will not result in the reverse bias on the first varicap diode VCD1. Similarly, the anode and kathode of the second varicap diode VCD2 is connected to Vcc, hence it will not result in the reverse bias on the second varicap diode VCD2.

Figure 6:
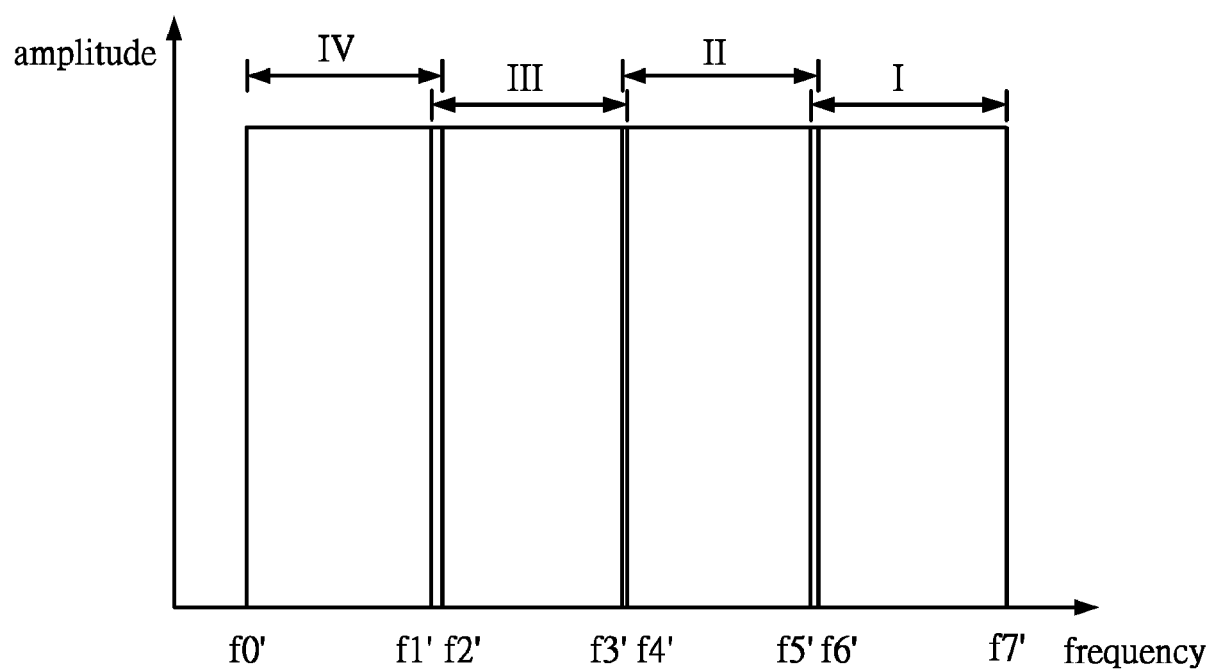
FIG. 6 illustrates the output frequency of the presently invented VCO.

Please refer to FIG. 6, which illustrates the output frequency of the presently invented VCO. As illustrated, the adjustable output frequency tuning range is between f0'~f7'; in which the first band I (f5'~f7') is completed by a first capacitance value c1 provided by a first controllable capacitor path in the switch capacitance bank 140 and a changeable capacitance value ($\Delta c1$) provided by a first controllable varactor path in the switch varactor bank 142; the second band II (f3'~f6') is completed by the first capacitance value c1 plus a second capacitance value c2, provided respectively by the first and second controllable capacitor paths (c1+c2) in the switch capacitance bank 140, and the changeable capacitance value ($\Delta c1+\Delta c2$) provided respectively by the first and second controllable varactor paths in the switch varactor bank 142; the third band III (f1'~f4') is completed by the first capacitance value c1 plus the second capacitance value c2 and the third capacitance value c3, provided respectively by the first, second and third controllable capacitor paths (c1+c2+c3) in the switch capacitance bank 140 and the changeable capacitance value ($\Delta c1+\Delta c2+\Delta c3$) provided respectively by the first, second and third controllable varactor paths in the switch varactor bank 142; and the fourth band IV (f0'~f2') is completed by the first capacitance value c1 plus the second capacitance value c2, the third capacitance c3 and the fourth capacitance c4, provided respectively by the first, second, third and fourth controllable capacitor paths (c1+c2+c3+c4) in the switch capacitance bank 140 and the changeable capacitance value ($\Delta c1+\Delta c2+\Delta c3+\Delta c4$) provided respectively by the first, second, third and fourth controllable varactor paths in the switch varactor bank 142.

As known in the art, the output frequency of VCO is proportional to $1/\sqrt{LC}$. Therefore, when the number of controllable capacitor path connected between node c and node d increases, the number of controllable varactor path connected between node c and node d increases accordingly. Thus, the changeable capacitance value provided by the switch varactor bank 142 will expand. By designing each changeable capacitance value provided by controllable varactor path the width of band can be compensated, and each bandwidth can be kept consistently. When using the presented switch varactor bank 142 to keep each bandwidth consistent, maintaining Kvco in a fixed value can be ensured and design of PLL is simplified.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A variable capacitance applied to a voltage controlled oscillator, comprising:
    a switch capacitance bank, including a plurality of controllable capacitor paths, for selectively connecting between a first node and a second node in parallel; and
    a switch variator bank, including a plurality of controllable variactor paths, for selectively connecting between the first node and the second node in parallel;
    wherein each said controllable variactor path provides a tunable capacitance value according to an input voltage, and comprises a first capacitor, a first varicap diode, a switch, a second varicap diode, and a second capacitor connected in series between the first node and the second node.

2. The variable capacitance according to claim 1, wherein the more the controllable variactor paths connected between the first node and the second node the more the controllable capacitor paths connected between the first node and the second node.

3. The variable capacitance according to claim 1, wherein each said controllable variactor path further comprises a varicap diode for receiving the input voltage to change a width of depletion region in the varicap diode and to provide the tunable capacitance value.

4. The variable capacitance according to claim 3, wherein each said controllable variactor path further comprises a switch connected with the varicap diode in series and a switch control terminal is connected to a control terminal of the switch.

5. The variable capacitance according to claim 4, wherein the switch is a FET and a gate of the FET is connected to the control terminal of the switch.

6. The variable capacitance according to claim 1, wherein one end of the first capacitor is connected to the first node, the other end of the first capacitor is connected to a kathode of the first varicap diode; an anode of the first varicap diode is connected to one end of the switch, the other end of the switch is connected to the anode of the second varicap diode; the kathode of the second varicap diode is connected to one end of the second capacitor, and the other end of the second capacitor is connected to the second node.

7. The variable capacitance according to claim 6, wherein the switch is a FET and a gate of the FET is connected to a switch control terminal.

8. The variable capacitance according to claim 6, wherein the first varicap diode and the second varicap diode receive the input voltage to change widths of depletion regions in the first varicap diode and the second varicap diode and to provide the tunable capacitance values.

9. The variable capacitance according to claim 6, wherein each controllable variactor path further comprises:
 a not gate, having an input terminal connected to a switch control terminal;
 a first resistor, connecting between a control terminal of the switch and the switch control terminal;
 a second resistor, having one end connecting to the anode of the second varicap diode;
 a fifth P transistor, having a source connected the other end of the second resistor, a gate connecting to the switch control terminal, a drain connecting to a voltage source;
 a fourth N transistor, having a drain connecting to the source of the fifth P transistor, a gate connecting to the switch control terminal, a source connecting to a ground;
 a third resistor, having one end connecting to the kathode of the second varicap diode;
 a sixth P transistor, having a source connecting the other end of the third resistor, a gate connecting to the switch control terminal, a drain connecting to the voltage source;
 a sixth resistor, having one end connecting to a voltage control terminal;
 a fifth N transistor, having a drain connecting to the source of the sixth P transistor, a gate connecting to the switch control terminal, a source connecting to the other end of the sixth resistor;
 a seventh P transistor, having a source connecting to the source of the sixth P transistor, a gate connecting to an output terminal of the not gate, a drain connecting to the source of the fifth N transistor;
 a fourth resistor, having one end connecting to the anode of the first varicap diode;
 a fourth P transistor, having a source connected the other end of the fourth resistor, a gate connecting to the switch control terminal, a drain connecting to the voltage source;
 a third N transistor, having a drain connecting to the source of the fourth P transistor, a gate connecting to the switch control terminal, a source connecting to the ground;
 a fifth resistor, having one end connecting to the kathode of the first varicap diode;
 a third P transistor, having a source connecting the other end of the fifth resistor, a gate connecting to the switch control terminal, a drain connecting to the voltage source;
 a second N transistor, having a drain connecting to the source of the third P transistor, a gate connecting to the switch control terminal, a source connecting to the source of the fifth N transistor; and
 a second P transistor, having a source connecting to the source of the third P transistor, a gate connecting to the output terminal of the not gate, a drain connecting to the source of the fifth N transistor.

* * * * *